US011862540B2

(12) United States Patent
Heng

(10) Patent No.: US 11,862,540 B2
(45) Date of Patent: Jan. 2, 2024

(54) MOLD FLOW BALANCING FOR A MATRIX LEADFRAME

(71) Applicant: STMicroelectronics SDN BHD, Muar (MY)

(72) Inventor: Yh Heng, Muar (MY)

(73) Assignee: STMicroelectronics SDN BHD, Muar (MY)

( * ) Notice: Subject to any disclaimer, the term of this patent is extended or adjusted under 35 U.S.C. 154(b) by 282 days.

(21) Appl. No.: 17/165,492

(22) Filed: Feb. 2, 2021

(65) Prior Publication Data

US 2021/0280502 A1 Sep. 9, 2021

Related U.S. Application Data

(60) Provisional application No. 62/985,949, filed on Mar. 6, 2020.

(51) Int. Cl.
*H01L 23/495* (2006.01)
*H01L 23/31* (2006.01)
*H01L 21/56* (2006.01)

(52) U.S. Cl.
CPC ...... *H01L 23/49551* (2013.01); *H01L 21/561* (2013.01); *H01L 21/565* (2013.01); *H01L 23/3107* (2013.01)

(58) Field of Classification Search
CPC ......... H01L 23/49544; H01L 23/49551; H01L 23/49541; H01L 23/49565; H01L 23/3107–315; H01L 21/561; H01L 21/565
See application file for complete search history.

(56) References Cited

U.S. PATENT DOCUMENTS

| 5,197,183 A * | 3/1993 | Chia ................. B29C 45/14655 257/E23.047 |
| 5,924,190 A | 7/1999 | Lee et al. |
| 6,118,184 A | 9/2000 | Ishio et al. |
| 6,329,705 B1 * | 12/2001 | Ahmad ............. H01L 23/49548 257/676 |
| 2002/0050630 A1 * | 5/2002 | Tiziani .................... H01L 23/31 257/676 |
| 2008/0067646 A1 | 3/2008 | Tellkamp |
| 2008/0073758 A1 * | 3/2008 | James ................... H01L 21/565 257/E23.047 |
| 2019/0122900 A1 * | 4/2019 | Hashizume ....... H01L 23/49541 |

FOREIGN PATENT DOCUMENTS

CN 102709268 A 10/2012

OTHER PUBLICATIONS

Nguyen, L. T.: "Wire Bond Behavior During Molding Operations of Electronic Packages," Polymer Engineering and Science, Jul. 1988, vol. 28, No. 14, pp. 926-943.
EP Search Report and Written Opinion for family-related application, EP Appl. No. 21160215.6, report dated Jul. 19, 2021, 12 pages.

* cited by examiner

*Primary Examiner* — Yu Chen
(74) *Attorney, Agent, or Firm* — Crowe & Dunlevy

(57) ABSTRACT

A frame includes leadframe units arranged in a matrix. Each leadframe unit has a die pad and tie bars connected to and extending from the die pad. Each tie bar includes an internal tie bar portion and an external tie bar portion. The internal tie bar portion of at least one tie bar includes a cut separating a part of the internal tie bar portion from the external tie bar portion. An out-of-plane bend in that part forms a mold flow control structure.

10 Claims, 4 Drawing Sheets

MOLD FLOW BALANCING FOR A MATRIX LEADFRAME

CROSS-REFERENCE TO RELATED APPLICATION

This application claims priority from United States Provisional Application for Patent No. 62/985,949, filed Mar. 6, 2020, the disclosure of which is incorporated by reference.

TECHNICAL FIELD

The present invention generally relates to the configuration of a leadframe, for example of the quad flat packaging (QFP) type, and to a technique for using the structure of the leadframe to control the flow of encapsulating mold material during the process of transfer molding.

BACKGROUND

Reference is made to FIG. 1 which shows a top view of a quad flat packaging (QFP) type leadframe 10. The leadframe 10 is made from a sheet of metal material, for example a copper or a copper alloy material, having a thickness of, for example, 100-300 µm. The leadframe 10 is fabricated to include a number of structures, with the fabrication generally comprising some form of stamping or etching operation to define the size and shape of the structures. The included structures of the leadframe 10 comprise a die pad 12 that generally has the shape of quadrilateral, such as a rectangular shape or a square shape (as shown), in top view. The area of the die pad 12 is sized to receive and support an integrated circuit (IC) chip (not shown; see FIGS. 2A-2B) which is mounted to the upper surface of the die pad. The leadframe 10 structures further comprise a plurality of tie bars 14 which are connected to the die pad 12 and extend away from the die pad. The tie bars 14 primarily function to support the die pad 12, and the mounted IC chip, within the mold cavity during the transfer molding process. In the illustrated example of FIG. 1, the tie bars 14 radially extend away from the die pad 12 from the four corners of the quadrilaterally-shaped die pad. In an alternative embodiment, the tie bars 14 may extend perpendicularly from the four side edges of the quadrilaterally-shaped die pad. The tie bars 14 include an internal tie bar portion 4 and an external tie bar portion 8. The internal tie bar portion 4 provides the portion of each tie bar 14 which will be encapsulated by the molding material within the resulting IC package. The external tie bar portion 8 will be outside the resulting IC package and is typically discarded following completion of the packaging process. The leadframe 10 structures further comprise a plurality of leads 16 which extend from, but are not directly connected to, the four side edges of the die pad 12. The leads 16 include an internal lead portion 18 and an external lead portion 20. The internal lead portion 18 provides the portion of each lead 16 which will be encapsulated by the molding material within the resulting IC package and to which the mounted IC chip is electrically connected. The external lead portion 20 provides the portion of each lead 16 which will extend externally from the resulting IC package. The leads 16 are connected to each other and to the tie bars 14 using a dam bar 24 structure of the leadframe 10 which extends parallel to, and is spaced apart from, each side edge of the die pad 12.

The dash-dotted outline indicates the general extent of the mold cavity 52 for the transfer molding process (the extent of the mold cavity generally coinciding with (adjacent to) the inside edge of the dam bar 24). The dashed outline indicates the extent of a leadframe unit which may be replicated and tiled to form a frame which includes a plurality of leadframe units arranged in a matrix format. The internal tie bar portion 4 extends between the die pad and the dam bar, and the external tie bar portion 8 extends from the dam bar to the perimeter edge of the leadframe unit (for example, at a corner thereof). Similarly, the internal lead portion 18 extends between adjacent the die pad and the dam bar, and the external lead portion 20 extends from the dam bar to the perimeter edge of the leadframe unit (for example, at a side edge thereof).

FIG. 2A illustrates a cross-section of the leadframe 10 taken along line A-A in FIG. 1. Although the upper surface of the die pad 14 is illustrated in this cross-section to be co-planar with the upper surface of the leads 16, it will be understood that this is just an example and that some leadframe configurations utilize a sunken die pad which is positioned below the leads. FIG. 2B illustrates a cross-section of the leadframe 10 taken along line B-B in FIG. 1. The IC chip is mounted to the die pad 12 and bonding wires 30 electrically connect pads on the upper surface of the IC chip to a proximal end of the internal lead portion 18 of each lead 16.

The assembly of the leadframe 10 with the attached and wirebonded IC chip is clamped between an upper half 50a and lower half 50b of a two part mold 50 used in a transfer molding process to encapsulate the IC chip and produce a packaged IC device. The mold 50 defines a cavity 52 within which the die pad 12, internal tie bar portions 4 of the tie bars 14 and internal lead portions 18 of the leads 16 are located. The external lead portion 20 of each lead 16 extends beyond the cavity 52 and is clamped by the mold 50. Likewise, the external tie bar portion 8 of each tie bar 14 extends beyond the cavity and is clamped by the mold 50. The mold cavity 52 is connected through a gate 56 to a mold runner 58 that is filled with an encapsulation material (generally, a mold compound such as a resin or epoxy-based material). In response to an applied force, the encapsulation material is delivered by the mold runner 58 and injected into the cavity 52 through the gate 56. The flow rate of the encapsulation material is controlled by the applied force, the lengths and cross-sections of the mold runner 58, the cross-section of the gate 56, the temperature, and the viscosity and flow characteristics of the encapsulation material. Following injection, the encapsulation material solidifies to form a package which encapsulates the IC chip. The resulting structure is then ejected from the mold 50 and the external lead portions 20 are severed and the dam bar 24 is cut to separate the leads 16 from each other. Furthermore, the external tie bar portions 8 of the tie bars 14 located outside the package are removed. The external lead portion 20 of each lead 16 is then bent to shape as needed.

In the implementation shown by FIG. 2B, the gate 56 is located at a corner of the mold cavity 52 corresponding to the location of one of the tie bars 14. In an alternative implementation, the gate 56 may instead be located at a side edge of the mold cavity 52, preferably at a location where there are no leads 16.

It is common for a frame to be used which includes a plurality of leadframe units arranged in a matrix format. As noted above in connection with FIG. 1, the dashed outline indicates the extent of each leadframe unit. FIG. 3 illustrates a portion of a frame where the matrix includes plural leadframe units arranged with one column and three rows. As an example, the frame may comprise a 3×10 matrix of leadframe units (three columns, ten rows) or a 4×15 matrix of leadframe units (four columns, fifteen rows).

FIG. 3 further shows, in a schematic way, additional detail concerning the runner system 58 and gates 56 for a given column of leadframe units. Again, the dash-dotted outline indicates the general extent of each mold cavity 52 and each gate 56 from the mold runner 58 is positioned at a corner of the mold cavity where a tie bar 14 is located. The mold runner 58 extends parallel to the column and simultaneously delivers the encapsulation material to each mold cavity 52 along that column. This system is replicated for each column of the plural columns included in the matrix for the frame.

As the number of rows in the matrix increases, it becomes increasingly difficult to balance the flow of encapsulation material to each of the mold cavities 52 along the column. There is a need in the art to address this problem.

SUMMARY

In an embodiment, a frame comprises: a plurality of leadframe units arranged in a matrix, wherein each leadframe unit comprises: a die pad; and a plurality of tie bars connected to and extending from the die pad, wherein each tie bar includes an internal tie bar portion and an external tie bar portion, and wherein the internal tie bar portion of one tie bar of said plurality of tie bars includes a cut separating a part of said internal tie bar portion from the external tie bar portion, wherein said part includes a bend which is out of a plane coinciding with an upper surface of the tie bars to form a mold flow control structure.

In an embodiment, a packaged integrated circuit comprises: a leadframe including: a die pad; a plurality of leads; and a plurality of tie bars connected to and extending from the die pad; wherein each tie bar includes an internal tie bar portion, and wherein the internal tie bar portion of one tie bar of said plurality of tie bars includes a bend which is out of a plane coinciding with an upper surface of the tie bars, said bend forming a bent portion such that there is an obtuse angle between an upper surface of said bent portion and the upper surface of the die pad to form a mold flow control structure; an integrated circuit chip mounted to the upper surface of the die pad; electrical connections between the integrated circuit chip and the leads; and a molded package encapsulating the die pad, the integrated circuit chip, the electrical connections, internal portions of said leads and said bent portion of said one tie bar of said plurality of tie bars.

In an embodiment, a method comprises: installing a frame in a two part mold which includes a plurality of mold cavities, wherein the frame comprises: a plurality of leadframe units arranged in a matrix, wherein each leadframe unit comprises: a die pad; and a plurality of tie bars connected to and extending from the die pad, wherein each tie bar includes an internal tie bar portion and an external tie bar portion, and wherein the internal tie bar portion of one tie bar of said plurality of tie bars includes a cut separating a part of said internal tie bar portion from the external tie bar portion, and wherein said part includes a bend which is out of a plane coinciding with an upper surface of the tie bars to form a mold flow control structure; and simultaneously injecting a molding compound into each mold cavity with the mold flow control structures of the leadframe units balancing mold flow among the plurality of mold cavities.

BRIEF DESCRIPTION OF THE DRAWINGS

For a better understanding of the embodiments, reference will now be made by way of example only to the accompanying figures in which.

DETAILED DESCRIPTION

Figure 1:
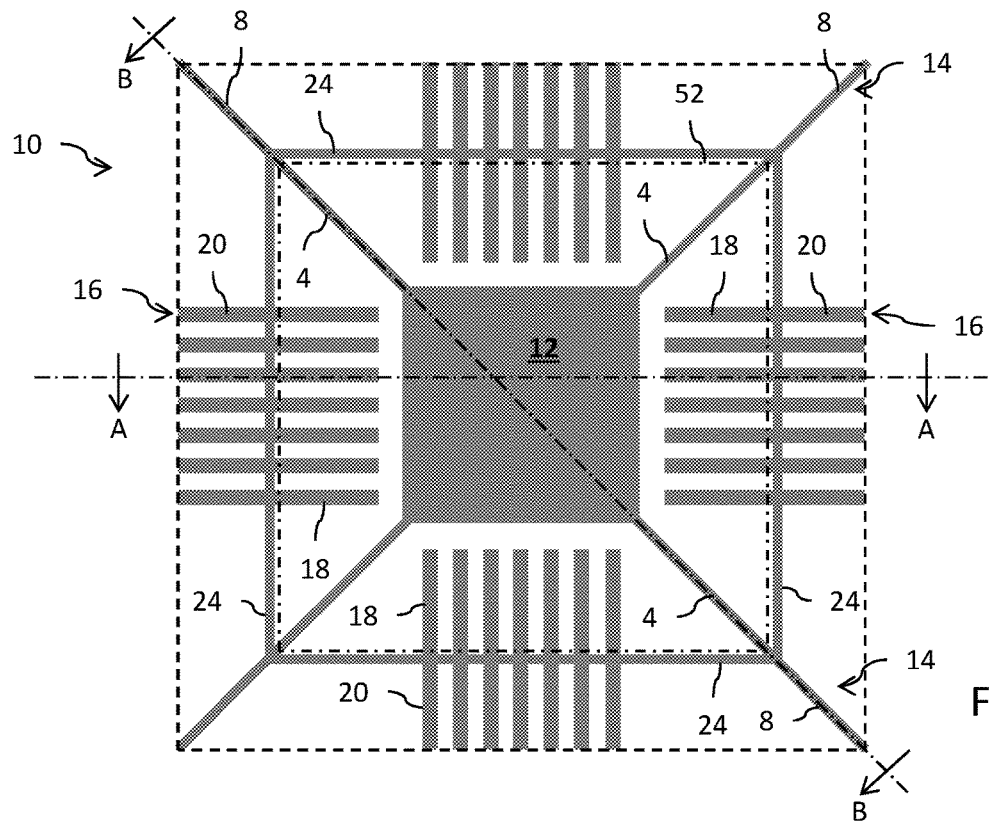
FIG. 1 illustrates a top view of an embodiment for a quad flat packaging (QFP) type leadframe.
Figure 2A:
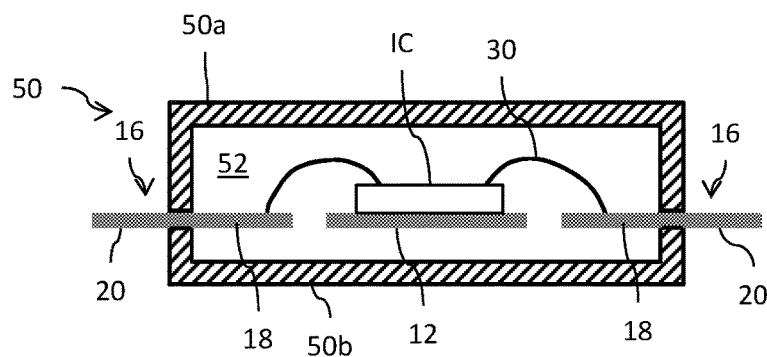
FIGS. 2A-2B illustrate cross-sections of the leadframe in FIG. 1.
Figure 2B:
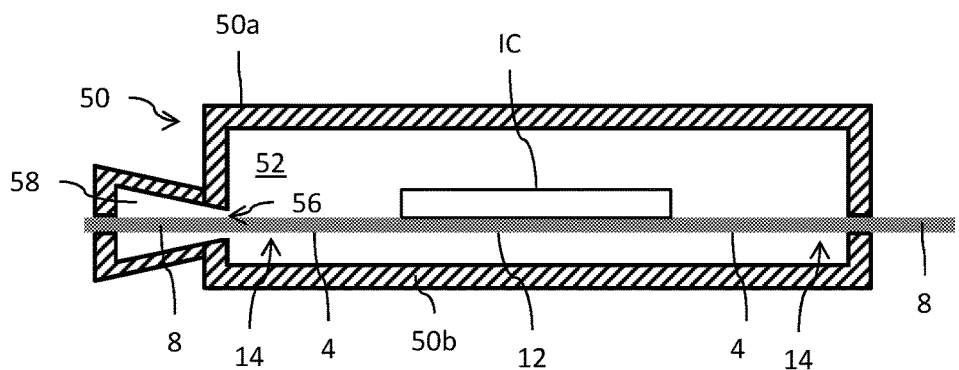
Figure 3:
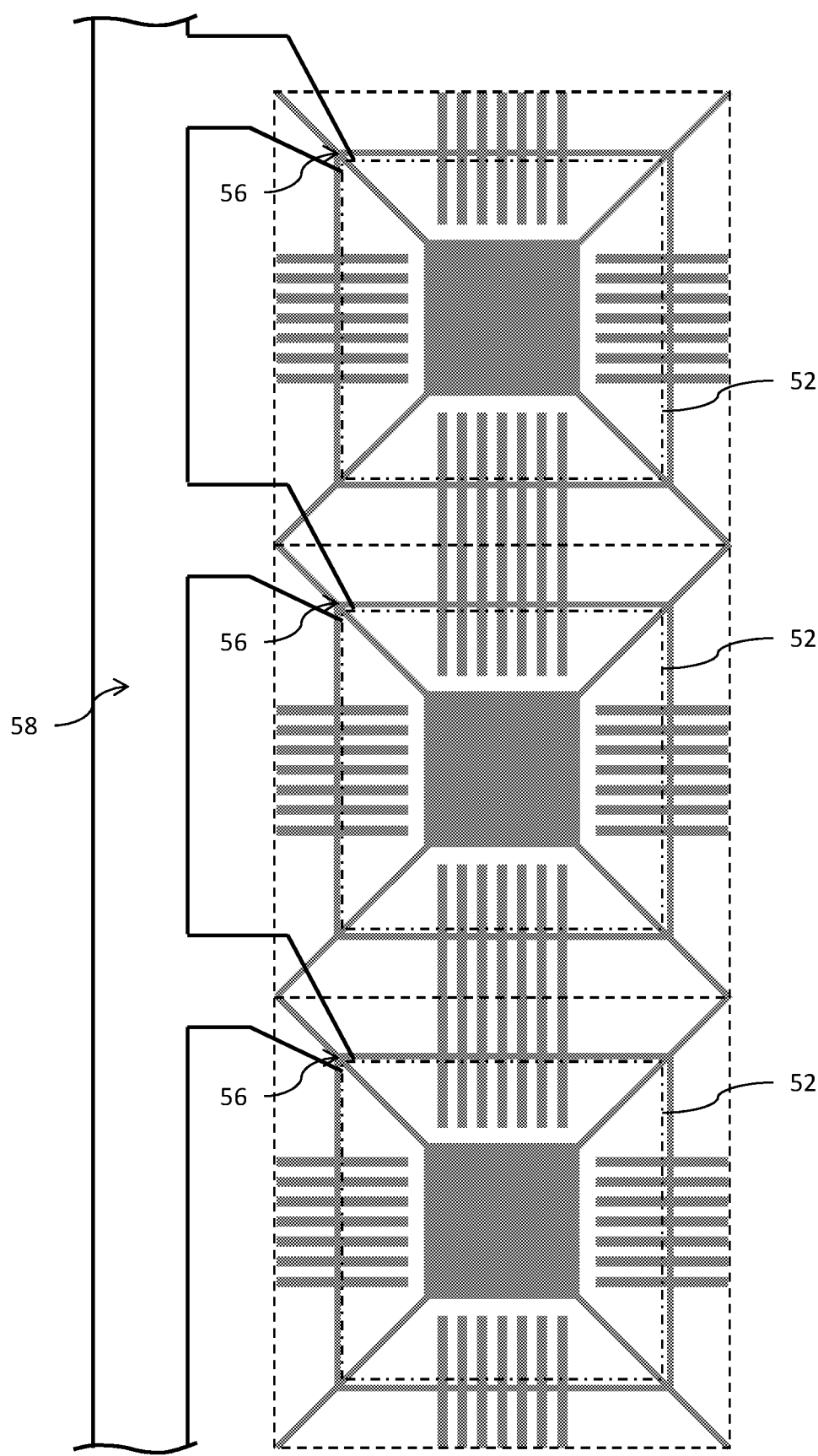
FIG. 3 illustrates a partial frame of leadframe units arranged in a matrix format.
Figure 4:
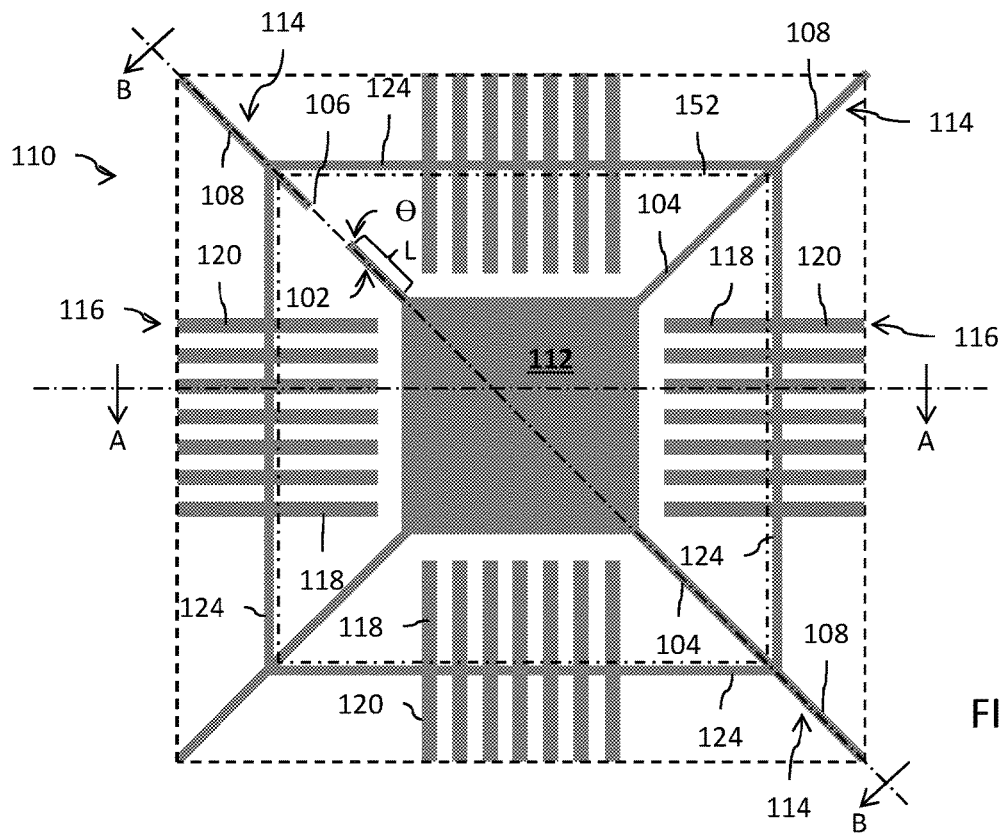
FIG. 4 illustrates a top view of another embodiment for a QFP type leadframe.

Reference is made to FIG. 4 which shows a top view of a quad flat packaging (QFP) type leadframe 110. The leadframe 110 is made from a sheet of metal material, for example a copper or a copper alloy material, having a thickness of, for example, 100-300 μm. The leadframe 110 is fabricated to include a number of structures, with the fabrication generally comprising some form of stamping or etching operation to define the size and shape of the structures. The included structures of the leadframe 110 comprise a die pad 112 that generally has the shape of quadrilateral, such as a rectangular shape or a square shape (as shown), in top view. The area of the die pad 112 is sized to receive and support an integrated circuit (IC) chip (not shown; see FIGS. 5A-5B) which is mounted to the upper surface of the die pad. The leadframe 110 structures further comprise a plurality of tie bars 114 which are connected to the die pad 112 and extend away from the die pad. The tie bars 114 primarily function to support the die pad 112, and the mounted IC chip, within the mold cavity during the transfer molding process. In the illustrated example of FIG. 4, the tie bars 114 radially extend away from the die pad 112 from the four corners of the quadrilaterally-shaped die pad. In an alternative embodiment, the tie bars 114 may extend perpendicularly from the four side edges of the quadrilaterally-shaped die pad. The tie bars 114 include an internal tie bar portion 104 and an external tie bar portion 108. The internal tie bar portion 104 provides the portion of each tie bar 114 which will be encapsulated by the molding material within the resulting IC package. The external tie bar portion 108 will be outside the resulting IC package and is typically discarded. The leadframe 110 structures further comprise a plurality of leads 116 which extend from, but are not directly connected to, the four side edges of the die pad 112. The leads 116 include an internal lead portion 118 and an external lead portion 120. The internal lead portion 118 provides the portion of each lead 116 which will be encapsulated by the molding material within the resulting IC package and to which the mounted IC chip is electrically connected. The external lead portion 120 provides the portion of each lead 116 which will extend externally from the resulting IC package. The leads 116 are connected to each other and to the tie bars 114 using a dam bar 124 structure of the leadframe 110 which extends parallel to, and is spaced apart from, each side edge of the die pad 112.

The dash-dotted outline indicates the general extent of the mold cavity 152 for the transfer molding process (the extent of the mold cavity generally coinciding with (adjacent to) the inside edge of the dam bar 124). The dashed outline indicates the extent of a leadframe unit which may be replicated and tiled to form a frame which includes a plurality of leadframe units arranged in a matrix format. The internal tie bar portion 104 extends between the die pad and the dam bar, and the external tie bar portion 108 extends from the dam bar to the perimeter edge of the leadframe unit (for example, at a perimeter corner thereof). Similarly, the internal lead portion 118 extends between adjacent the die pad and the dam bar, and the external lead portion 120 extends from the dam bar to the perimeter edge of the leadframe unit (for example, at a perimeter side edge thereof).

Figure 5A:
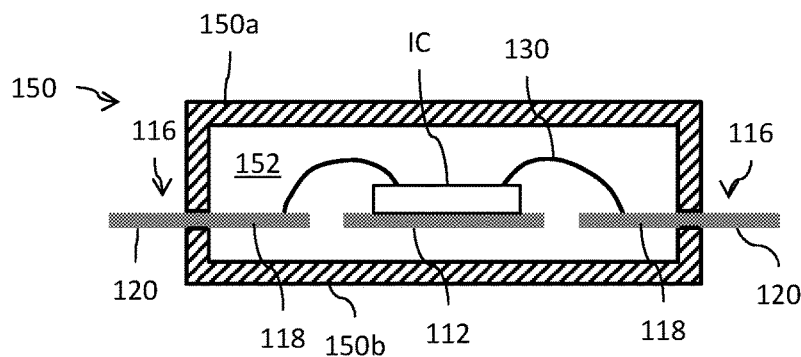
FIGS. 5A-5B illustrate cross-sections of the leadframe in FIG. 4.
Figure 5B:
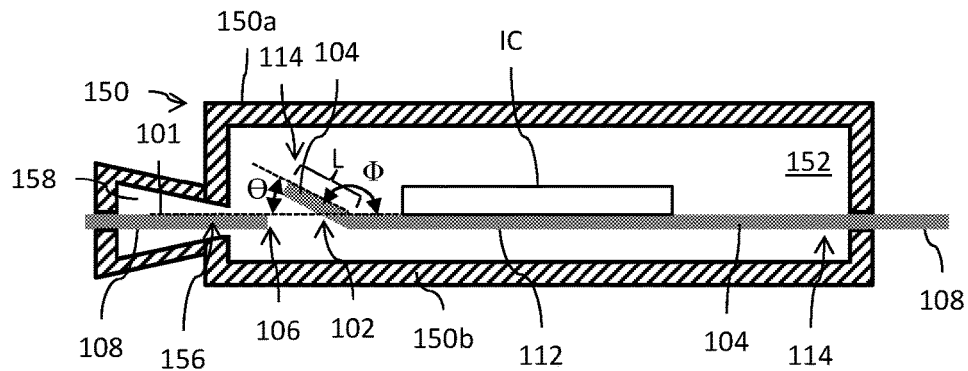

FIG. 5A illustrates a cross-section of the leadframe 110 taken along line A-A in FIG. 4. Although the upper surface of the die pad 14 is illustrated in this cross-section to be co-planar with the upper surface of the leads 16, it will be understood that this is just an example and that some leadframe configurations utilize a sunken die pad which is positioned below the leads. FIG. 5B illustrates a cross-section of the leadframe 110 taken along line B-B in FIG. 4. The IC chip is mounted to the die pad 112 and bonding wires 130 electrically connect pads on the upper surface of the IC chip to a proximal end of the internal lead portion 118 of each lead 116.

The assembly of the leadframe 110 with the attached and wirebonded IC chip is clamped between an upper half 150a and lower half 150b of a two part mold 150 used in a transfer molding process to encapsulate the IC chip and produce a packaged IC device. The mold 150 defines a cavity 152 within which the die pad 112, internal tie bar portions 104 of the tie bars 114 and internal lead portions 118 of the leads 116 are located. The external lead portion 120 of each lead 116 extends beyond the cavity 152 and is clamped by the mold 150. Likewise, the external tie bar portion 108 of each tie bar 114 extends beyond the cavity and is clamped by the mold 150. The mold cavity 152 is connected through a gate 156 to a mold runner 158 that is filled with an encapsulation material (generally, a mold compound such as a resin or epoxy-based material). In response to an applied force, the encapsulation material is delivered by the mold runner 158 and injected into the cavity 152 through the gate 156. The flow rate of the encapsulation material is controlled by the applied force, the lengths and cross-sections of the mold runner 158, the cross-section of the gate 156, the temperature, and the viscosity and flow characteristics of the encapsulation material. Following injection, the encapsulation material solidifies to form a package which encapsulates the IC chip. The resulting structure is then ejected from the mold 150 and the external lead portions 120 are severed and the dam bar 124 is cut to separate the leads 116 from each other. Furthermore, the external tie bar portions 108 the tie bars 114 located outside the package are removed (with the internal tie bar portions 104 ending at an outer surface of the package). The external lead portion 120 of each lead 116 is then bent to shape as needed.

To address concerns with controlling the flow of encapsulation material into the mold cavity 152 during the transfer molding process, at least one of the tie bars 114 is configured to provide a mold flow control structure 102 within the mold cavity 152. In particular, the internal tie bar portion 104 of the tie bar 114 corresponding to the location of the gate 156 is cut (reference 106; using the stamping or etching operation) adjacent to the dam bar 124. The part of the internal tie bar portion 104 of the tie bar 114 which remains connected to the die pad 112 is further bent out of a plane (reference 101) coinciding with an upper surface of the tie bars in the direction of which is perpendicular to the plane defined by the top surface of the die pad 112 to form the mold flow control structure 102. The bent portion of the part of the internal tie bar portion 104 of the tie bar 114 forms an acute angle $\Theta$ relative to the plane 101 for the top surface of the external tie bar portion 108 the tie bar 114 (and a corresponding obtuse angle $\Phi$ relative to the top surface of the die pad, where $\Theta=180°-\Phi$). While FIG. 5B shows a case where the cut internal tie bar portion 104 of the tie bar 114 has been bent in the direction of the upper half 150a of the two part mold 150, it will be understood that this is by example only and that the bend can instead be made in the direction of the lower half 150b of the two part mold 150. The location of the bend may, for example, coincide with the corner (or side edge) of the die pad 112. Alternatively, the location of the bend may be positioned at a location along the length of the cut internal tie bar portion 4 of the tie bar 114 between the corner (or side edge) of the die pad 112 and the cut end of the tie bar.

In the implementation shown by FIG. 5B, the gate 156 is located at a corner of the mold cavity 512 corresponding to the location of one of the tie bars 114. In an alternative implementation, the gate 156 may instead be located at a side edge of the mold cavity 152, and again would correspond to the location of one of the tie bars 114.

Figure 6:
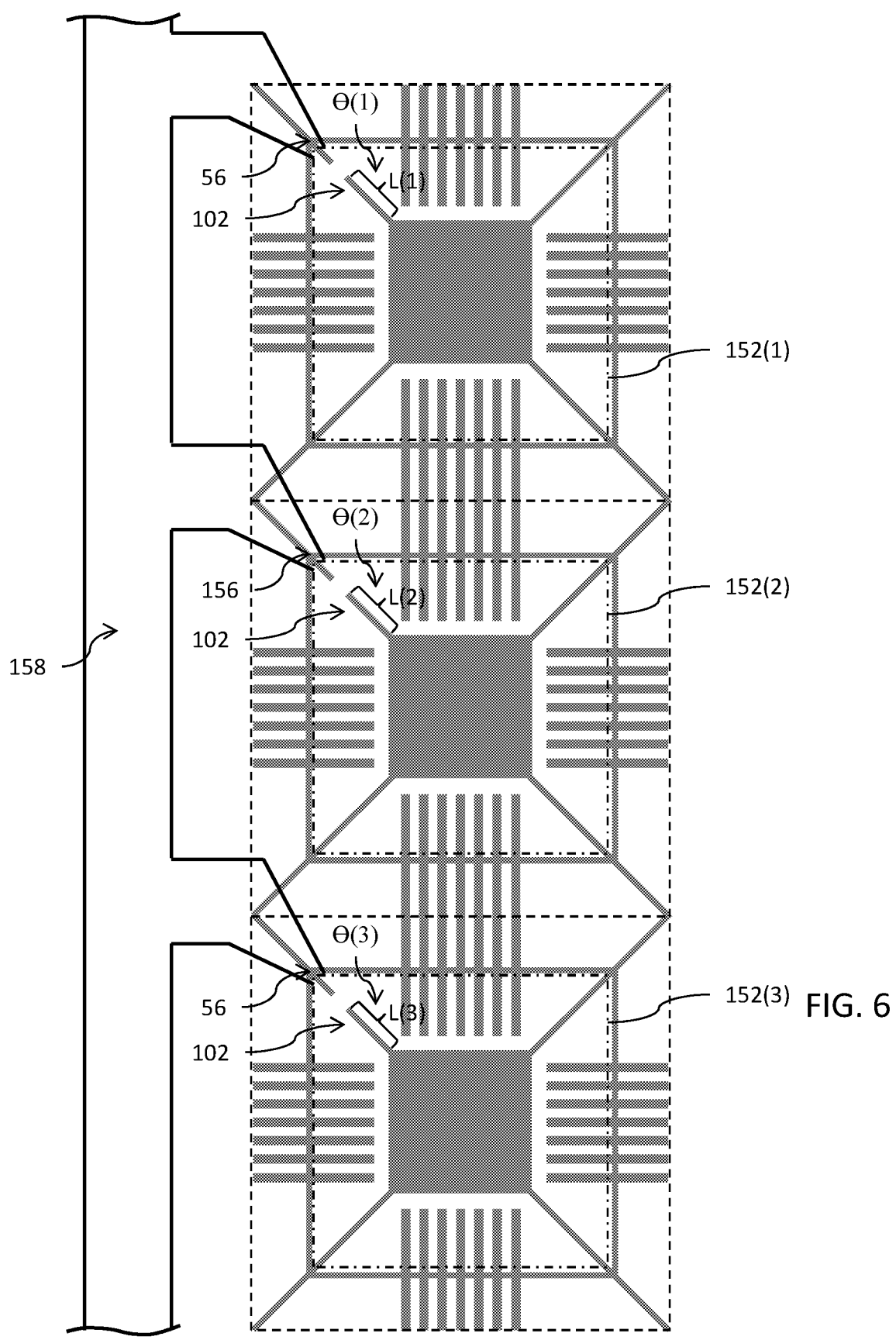
FIG. 6 illustrates a partial frame of leadframe units arranged in a matrix format.

It is common for a frame to be used which includes a plurality of leadframe units arranged in a matrix format. As noted above in connection with FIG. 4, the dashed outline indicates the extent of each leadframe unit. FIG. 6 illustrates a portion of a frame where the matrix includes plural leadframe units arranged with one column and three rows. As an example, the frame may comprise a 3×10 matrix of leadframe units (three columns, ten rows) or a 4×15 matrix of leadframe units (four columns, fifteen rows).

FIG. 6 further shows, in a schematic way, additional detail concerning the runner system 158 and gates 156 for a given column of leadframe units. Again, the dash-dotted outline indicates the general extent of each mold cavity 152 and each gate 156 from the mold runner 158 is positioned at a corner of the mold cavity where a tie bar 114 is located. The mold runner 158 extends parallel to the column and delivers the encapsulation material to each mold cavity 152 along that column. This system is replicated for each column of the plural columns included in the matrix.

The flow of encapsulation material that is simultaneously injected into each mold cavity 152 along the column can be adjusted by changing the shape of the mold flow control structure 102. This adjustment is effectuated in one way by controlled setting of the acute angle $\Theta$. For example, each mold flow control structure 102 along the length of a given column can have an individually selected acute angle $\Theta$. Indeed, in a preferred implementation, the acute angle $\Theta$ gradually changes (increasing or decreasing) from mold cavity 152 to mold cavity along the length of the column. Thus, the mold flow control structure 102 provided by the leadframe unit for a first cavity 152(1) connected to the mold runner 158 along the length of the column can have an acute angle $\Theta(1)$, the mold flow control structure 102 provided by the leadframe unit for a second cavity 152(2) connected to the mold runner 158 along the length of the column can have an acute angle $\Theta(2)$, and the mold flow control structure 102 provided by the leadframe unit for a third cavity 152(1) connected to the mold runner 158 along the length of the column can have an acute angle $\Theta(3)$, where $\Theta(1)\neq\Theta(2)\neq\Theta(3)$ and, more specifically, $\Theta(1)<\Theta(2)<\Theta(3)$ as an example.

In addition, a length L of the bent part of the internal tie bar portion 104 of the tie bar 114 forming the mold flow control structure 102 can be individually selected for each mold cavity along the length of the column. This is accomplished by selecting the location for making the cut 106 along the length of the cut 106 made to internal tie bar portion 104 of the tie bar 114. Alternatively, this is accomplished by selecting the location for the making of the bend. Thus, the bent part of the internal tie bar portion 104 of the mold flow control structure 102 provided by the leadframe unit for a first cavity 152(1) connected to the mold runner 158 along the length of the column can have a length L(1), the bent part of the internal tie bar portion 104 of the mold flow control structure 102 provided by the leadframe unit for a second cavity 152(2) connected to the mold runner 158 along the length of the column can have a length L(2), and the bent part of the internal tie bar portion 104 of the mold flow control structure 102 provided by the leadframe unit for a third cavity 152(1) connected to the mold runner 158 along the length of the column can have a length L(3), where L(1) L(2) L(3) and, more specifically, L(1)<L(2)<L(3) as an example.

The provision of the mold flow control structure 102 in general, and the controlled selection of angle Θ and length L for the bent part of the internal tie bar portion 104 in particular, assists in balancing the flow of encapsulation material to each mold cavity 152 along the column of the matrix so as to reduce the likelihood of a wire sweep and/or mold void occurrence.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A frame, comprising:
    a plurality of leadframe units arranged in a matrix, wherein each leadframe unit comprises:
    a die pad; and
    a plurality of tie bars connected to and extending from the die pad, wherein each tie bar includes an internal tie bar portion and an external tie bar portion, and wherein at least one tie bar of said plurality of tie bars includes a cut separating said internal tie bar portion of the at least one tie bar from the external tie bar portion of the at least one tie bar, and wherein said internal tie bar portion of the at least one tie bar includes a bend to form a bent internal tie bar portion providing a mold flow control structure;
    wherein the bent internal tie bar portion extends linearly from a location of the bend in the internal tie bar portion of the at least one tie bar to a location of the cut in the at least one tie bar, and
    wherein a length of the bent internal tie bar portion from the location of the bend to the location of the cut is different in each leadframe unit of said plurality of leadframe units in the frame.

2. First and second packaged integrated circuits, wherein each packaged integrated circuit comprises:
    a leadframe including:
    a die pad;
    a plurality of leads; and
    a plurality of tie bars connected to and extending from the die pad;
    wherein each tie bar includes an internal tie bar portion and an external portion, and
    wherein at least one tie bar of said plurality of tie bars includes a cut separating said internal tie bar portion of the at least one tie bar from the external tie bar portion of the at least one tie bar, and wherein said internal tie bar portion of the at least one tie bar includes a bend to form a bent internal tie bar portion that extends linearly from a location of the bend in the internal tie bar portion of the at least one tie bar to a location of the cut in the at least one tie bar;
    an integrated circuit chip mounted to the upper surface of the die pad;
    electrical connections between the integrated circuit chip and the leads; and
    a molded package encapsulating the die pad, the integrated circuit chip, the electrical connections and said bent internal tie bar portion of said one tie bar of said plurality of tie bars;
    wherein a length of the bent internal tie bar portion of the first packaged integrated circuit from the location of the bend to the location of the cut is different from a length of the bent internal tie bar portion of the second packaged integrated circuit from the location of the bend to the location of the cut.

3. The first and second packaged integrated circuits of claim 2, wherein external portions of said plurality of leads extend outside of the molded package.

4. The first and second packaged integrated circuits of claim 2, wherein the internal tie bar portion of each tie bar other than said at least one tie bar of said plurality of tie bars ends at an outer surface of the molded package.

5. The first and second packaged integrated circuits of claim 2, wherein a position of the internal tie bar portion of said at least one tie bar of said plurality of tie bars corresponds to a location wherein encapsulating material for making said molded package was injected.

6. The frame of claim 1, wherein the matrix includes a column of leadframe units and the length increases in size from leadframe unit to leadframe unit along said column.

7. The frame of claim 1, wherein each tie bar of the plurality of tie bars extends from a corner of the die pad towards a corner of each leadframe unit of the plurality of leadframe units.

8. The frame of claim 1, wherein each leadframe unit of the plurality of leadframe units further includes a dam bar, and wherein the internal tie bar portion of each tie bar of the plurality of tie bars extends between the die pad and the dam bar.

9. The frame of claim 8, wherein the external tie bar portion of each tie bar of the plurality of tie bars extends from the dam bar towards a perimeter of each leadframe unit of the plurality of leadframe units.

10. A frame, comprising:
    a plurality of leadframe units arranged in a matrix, wherein each leadframe unit comprises:
    a die pad; and
    a plurality of tie bars connected to and extending between the die pad and a dam bar, wherein at least one tie bar of said plurality of tie bars includes a cut separating an internal tie bar portion of said least one tie bar from the dam bar, and wherein said internal tie bar portion of said least one tie bar is bent at a location between the die pad and the cut to form a bent tie bar portion providing a mold flow control structure;

wherein the bent tie bar portion extends linearly from said location of the bend in said internal tie bar portion of said least one tie bar to a location of the cut in said at least one tie bar; and wherein a length of the bent internal tie bar portion from the location of the bend to the location of the cut is different in each leadframe unit of said plurality of leadframe units in the frame.

\* \* \* \* \*